(12) United States Patent
Alvarado et al.

(10) Patent No.: US 9,497,891 B2
(45) Date of Patent: Nov. 15, 2016

(54) EMBEDDED CHASSIS DUCTING SYSTEM FOR PARALLELIZING AIRFLOW THROUGH COMPONENTS ORIENTED IN SERIES

(71) Applicant: DELL PRODUCTS, L.P., Round Rock, TX (US)

(72) Inventors: Daniel Alvarado, Pflugerville, TX (US); Austin Michael Shelnutt, Leander, TX (US)

(73) Assignee: Dell Products, L.P., Round Rock, TX (US)

( * ) Notice: Subject to any disclaimer, the term of this patent is extended or adjusted under 35 U.S.C. 154(b) by 103 days.

(21) Appl. No.: 14/493,275

(22) Filed: Sep. 22, 2014

(65) Prior Publication Data

US 2016/0088774 A1    Mar. 24, 2016

(51) Int. Cl.
H05K 7/20          (2006.01)
H05K 7/14          (2006.01)
B21D 53/02         (2006.01)

(52) U.S. Cl.
CPC ........... H05K 7/20736 (2013.01); B21D 53/02 (2013.01); H05K 7/1488 (2013.01)

(58) Field of Classification Search
CPC . H05K 7/20736; H05K 7/1488; B21D 53/02
USPC ............................................ 361/695, 679.49
See application file for complete search history.

(56) References Cited

U.S. PATENT DOCUMENTS

| | | | |
|---|---|---|---|
| 5,021,924 A * | 6/1991 | Kieda ................. | H01L 23/4336 165/104.33 |
| 5,196,989 A * | 3/1993 | Zsolnay ................. | H05K 7/20 165/80.3 |
| 6,222,729 B1 * | 4/2001 | Yoshikawa ........ | H05K 7/20154 174/16.1 |
| 6,525,936 B2 * | 2/2003 | Beitelmal .......... | H05K 7/20727 165/122 |
| 6,867,967 B2 * | 3/2005 | Mok .......................... | G06F 1/16 236/49.3 |
| 7,751,186 B2 | 7/2010 | Moss et al. | |
| 7,885,062 B2 | 2/2011 | Wagner et al. | |
| 8,144,464 B2 | 3/2012 | Vanderveen et al. | |
| 8,310,832 B2 | 11/2012 | Vanderveen et al. | |
| 8,559,176 B2 | 10/2013 | Arflack et al. | |
| 2006/0012953 A1 | 1/2006 | Mills et al. | |
| 2012/0201001 A1 | 8/2012 | Aoki et al. | |
| 2012/0268890 A1 * | 10/2012 | Stock ........................ | G06F 1/20 361/679.53 |
| 2013/0153193 A1 * | 6/2013 | Li .......................... | H01L 23/367 165/185 |
| 2014/0038510 A1 | 2/2014 | Bailey et al. | |

* cited by examiner

Primary Examiner — Dion R Ferguson
Assistant Examiner — Mandeep S Buttar
(74) Attorney, Agent, or Firm — Isidore PLLC

(57) ABSTRACT

An information handling system (IHS) has a server chassis assembly including a server chassis with a cold air inlet and a hot air exhaust and provisioned with compute components that are series aligned. A ducting structure positioned in the server chassis defines a cold air plenum in fluid communication with the cold air inlet and a hot air plenum in fluid communication with the hot air exhaust. A shroud of the ducting structure separates the cold air plenum and the hot air plenum. Air drops are provided longitudinally along the shroud corresponding respectively to the respective compute components being cooled. The air drops are each in fluid communication between the cold air plenum and the hot air plenum. Hot air from one compute component is routed directly to the hot air plenum away from other compute components.

17 Claims, 8 Drawing Sheets

EMBEDDED CHASSIS DUCTING SYSTEM FOR PARALLELIZING AIRFLOW THROUGH COMPONENTS ORIENTED IN SERIES

RELATED APPLICATIONS

The present application is related to commonly-owned application entitled "BI-DIRECTIONAL AIRFLOW HEATSINK" to Alvarado, et al., filed on even date herewith.

BACKGROUND

1. Technical Field

This disclosure generally relates to information handling systems (IHSs), and more particular to an IHS chassis having internal cooling air ducting.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Integrated circuit (IC) manufacturers often dictate the geometric layout of components on a server board within a server chassis of an IHS. Multiple central processing unit (CPU) sockets and random access memory (RAM) modules are particular examples of such geometries that may be laid out without considerations for cooling within the server chassis. These geometric specifications coupled with the standard information technology (IT) rack layout used today can result in challenging cooling conditions. Heat dissipating components can be oriented in series with respect to the airflow path. As air moves through one component absorbing heat, the increased temperature of the air reduces cooling effectiveness for additional components. This process is often referred to as 'thermal shadowing' or preheating. A server chassis assembly that houses such serially configured heat dissipating components would benefit from a cooling system that mitigates thermal shadowing.

BRIEF SUMMARY

The illustrative embodiments of the present disclosure provide a server rack assembly, an information handling system (IHS), and a method of cooling compute components provisioned in a server chassis assembly of an IHS. According to at least one embodiment, an IHS includes a server chassis assembly having a server chassis with a cold air inlet and a hot air exhaust. A ducting structure is positioned in the server chassis. The ducting structure defines a cold air plenum in fluid communication with the cold air inlet. The ducting structure also defines a hot air plenum in fluid communication with the hot air exhaust. In addition, the ducting structure has a shroud that separates the cold air plenum and the hot air plenum. Air drops are provided longitudinally along the shroud corresponding respectively to the respective compute components being cooled. The air drops are each in fluid communication between the cold air plenum and the hot air plenum. The air drops direct cooling air supply in parallel through the shroud to corresponding compute components that are provisioned in the server chassis under the shroud of the ducting structure. The compute components can be series aligned between the cold air inlet and the hot air exhaust. The ducting structure prevents preheating by one compute component of the cooling air that is supplied to another computer component.

According to at least one aspect of the present disclosure, a method is provided of cooling of compute components provisioned in series alignment within a server chassis of an IHS. In one embodiment, the method includes directing a cold air supply to a cold air inlet of a chassis enclosure of the server chassis assembly. The method includes directing the cold air supply through a cold air plenum that is separated from the more than two components by a ducting structure. The method includes passing a first portion of the cold air supply through a shroud via respective air drops each corresponding to one of the compute components. The method includes directing hot air flow from the compute components to a hot air plenum that is (a) in fluid communication with a hot air exhaust of the chassis enclosure and that is (b) separated from the compute components. The method further includes expelling the hot air flow from the hot air exhaust of the chassis enclosure.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
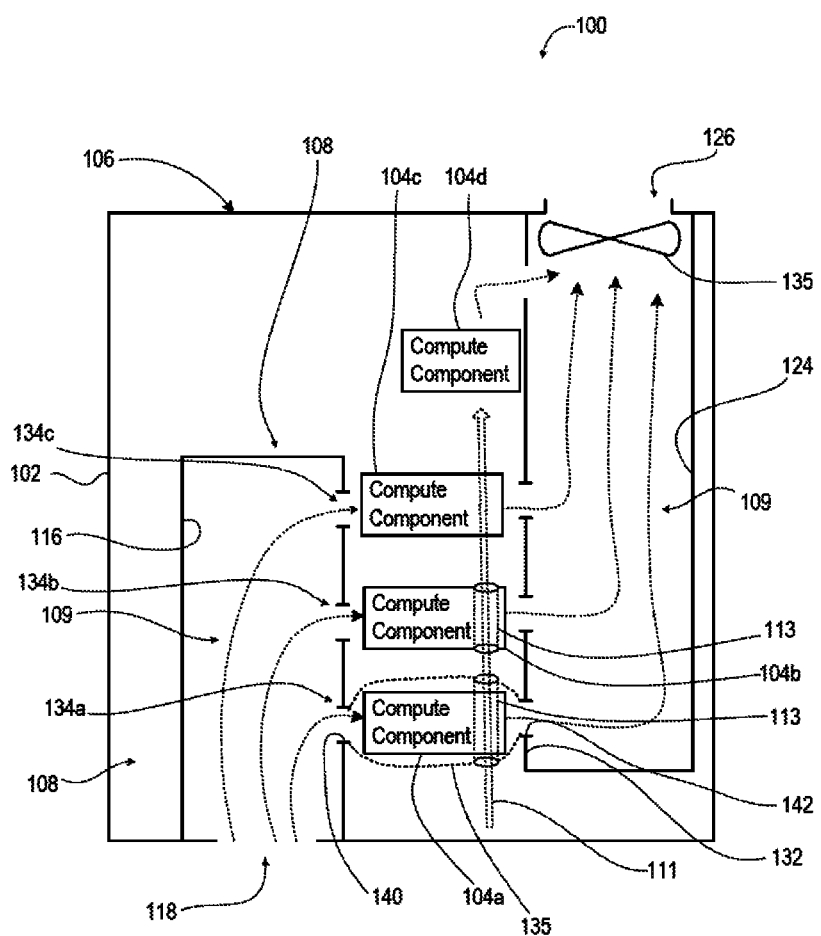
FIG. 1 illustrates a diagrammatic top view of a rack server of an information handling system having ducting structure that mitigate thermal shadowing of series-aligned compute components, according to one or more embodiments.

The present disclosure provides an information handling system (IHS) that has a server chassis assembly including a server chassis with a cold air inlet and a hot air exhaust. A ducting structure positioned in the server chassis defines a cold air plenum in fluid communication with the cold air inlet and a hot air plenum in fluid communication with the hot air exhaust. A shroud of the ducting structure separates the cold air plenum and the hot air plenum and covers compute components that are series aligned. Air drops correspond respectively to the respective locations of the compute components and are in fluid communication respectively between the cold and hot air plenums, directing separate plumes of the cooling air supply in parallel through the shroud. Accordingly, hot air from one compute component is not blown over another compute component that is thermally shadowed but directed away by the hot air plenum.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example IHS 100 having a server chassis 102 that houses functional compute components 104a-104d, which collectively form a functional server 106 that comprises or is a constituent portion of the IHS 100. The server 106 represents one of a plurality of various embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

With continued reference to FIG. 1, compute components 104a-104d can include a heatsink-mounted central processing unit (CPU), voltage regulators, Peripheral Component Interconnect Express (PCIe) redundant array of independent disks (RAID) card behind a motherboard, and a solid state drive (SSD). With conventional implementations of server chassis 102, the temperature of downstream compute components 104c from upstream compute components 104a, 104b can increase due to reduced air flow. The present innovation addresses these and other deficiencies by providing a ducting structure 108 that reduces pre-heating of a downstream compute component 104c by upstream compute components 104a, 104b by directing a first air flow 109. In one embodiment, the present innovation further provides for a second air flow 111 that bypasses the upstream compute components 104a, 104b via one or more tunnels 113 to provide cooling of the downstream compute components 104c-104d. For example, compute component 104c can receive a portion of first air flow 109 yet require supplemental cooling by the second air flow 111. For another example, the furthest downstream compute component 104d can receive little benefit from the first air flow 109 and rely upon the second air flow 111 for cooling.

With regard to the first air flow 109, the ducting structure 108 is positioned in the server chassis 102. The ducting structure 108 defines a cold air plenum 116 in fluid communication with a cold air inlet 118 of the server chassis 102. The ducting structure 108 defines a hot air plenum 124 in fluid communication with a hot air exhaust 126 of the server chassis 102. The ducting structure 108 has a shroud 132 that separates the cold air plenum 116 and the hot air plenum 124. The ducting structure 108 defines air drops 134a-134c, in parallel with each other. Each air drop 134a-134c is directed at and corresponds respectively to one of compute components 104a-104c. Each of the more than one air drop 134a-134c is in fluid communication between the cold air plenum 116 and the hot air plenum 124, respectively directing cooling air supply through the shroud 132.

Cold air can be pushed through the ducting structure 108. FIG. 1 illustrates first and second air flows 109, 111 alternatively being pulled through the ducting structure 108 by a fan 135. For clarity, only one fan 135 is depicted to draw both the first and second air flows 109, 111. Other embodiments can have one or more fans 135 dedicated to one of the first and second air flows 109, 111. The compute components 104a-104c are provisioned in the server chassis 102 under the shroud 132 of the ducting structure 108. The compute components 104a-104c are in series alignment with each other between the cold air inlet 118 and the hot air exhaust 126. Each air drop 134a-134c includes an intake opening 140 that receives cold air from the cold air plenum 116 and an outlet opening 142 that exhausts heated air from the compute component 104a-104c under the shroud 132 to the hot air plenum 124. Intake and outlet openings 140, 142 are a pair of openings on respective lateral sides of the shroud 132. The shroud 132 or air drops 134a-134c can include transverse barriers that prevent thermal shadowing. Alternatively, balancing of air flow across respective air drops 134a-134c can minimize pre-heating of other compute components 104a-104c by maintaining a transverse air flow between each paired intake and outlet opening 140, 142.

Figure 2:
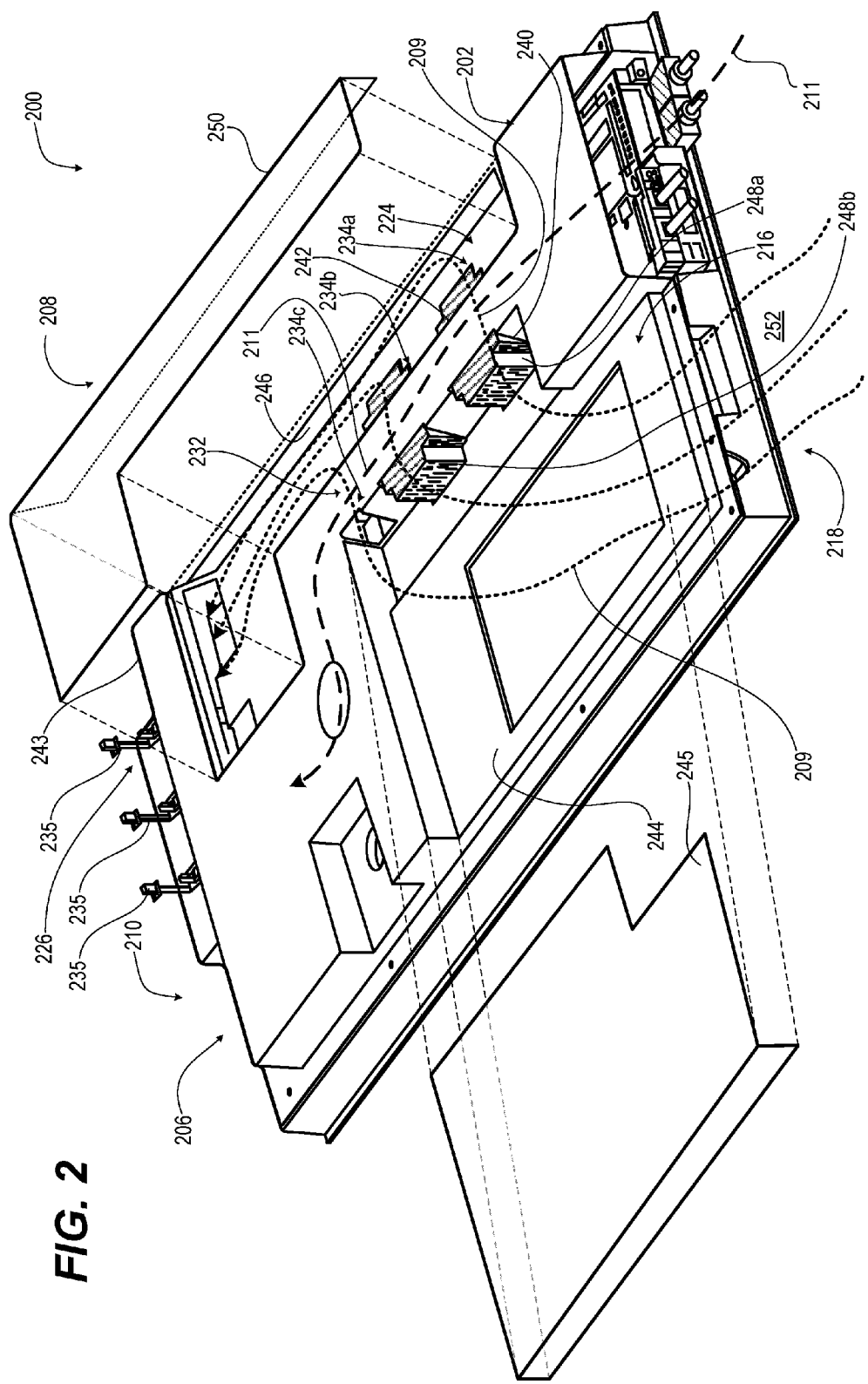
FIG. 2 illustrates a front left isometric view of a rack server having a ducting structure that mitigates thermal shadowing of series-aligned compute components, according to one or more embodiments.
Figure 3:
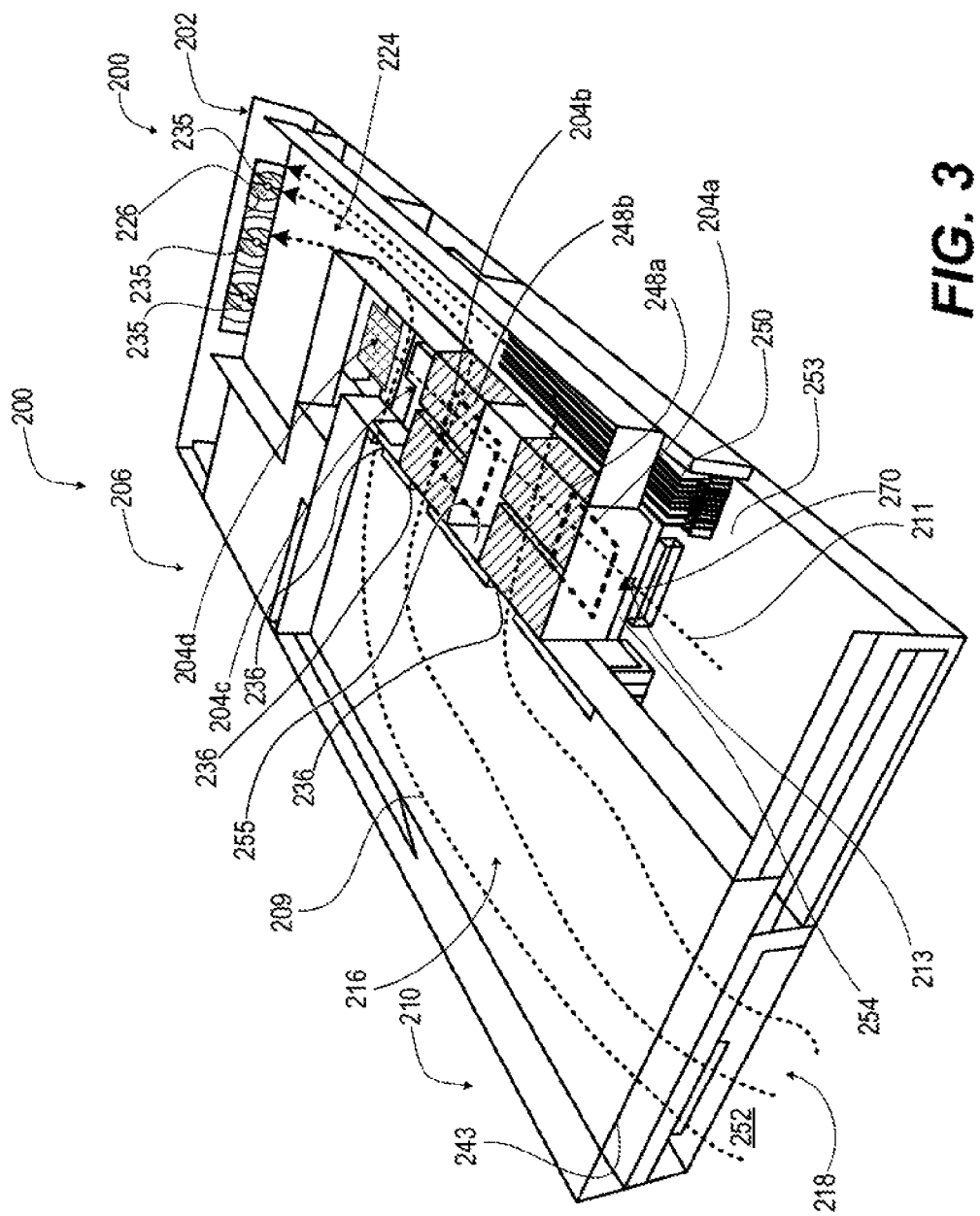
FIG. 3 illustrates the ducting structure of FIG. 2, according to one or more embodiment.

FIGS. 2-3 illustrate an example IHS 200 having a server chassis 202 that houses functional compute components 204a-204c (FIG. 1), which collectively form a functional server 206 that comprise or is a constituent portion of the IHS 200. With particular reference to FIG. 2, the server 206 further includes a ducting structure 208 that is provided in the server chassis 202 and functions to direct cooling air through the server 206 and remove exhaust air from the server 206. The server chassis 202 and ducting structure 208 form a server chassis assembly 210. The ducting structure 208 includes a molded tray 243 that overlays the compute components 204a-204c (FIG. 3). The ducting structure 208 defines a cold air plenum 216 that is in fluid communication with a cold air inlet 218 formed in the server chassis 202. In particular, a cold air recessed portion 244 formed in the molded tray 243 is closed by a cold air cover 245. The ducting structure 208 defines a hot air plenum 224 in fluid communication with a hot air exhaust 226 of the server chassis 202. In particular, a hot air recessed portion 246 formed in the molded tray 243 is closed by a hot air cover 250. A raised shroud 232 of the molded tray 243 separates the cold air plenum 216 and the hot air plenum 224. Each air drop 234a-234c corresponds respectively to one compute component 204a-204c under the raised shroud 232. Each air drop 234a-234c is in fluid communication respectively between the cold air plenum 216 and the hot air plenum 224 directing cooling air supply 252 in parallel through the raised shroud 232 as a first air flow 209. Each air drop 234a-234c includes an intake opening 240 that receives cold air from the cold air plenum 216 and an outlet opening 242 that exhausts heated air from the compute component 204a-204c under the raised shroud 232 to the hot air plenum 224. Under the raised shroud 232, a second air flow 211 is directed between the cold air inlet 218 and the hot air exhaust 226.

The first air flow 209 is separated from compute components 204a-204c by the ducting structure 208 as the first air flow 209 is directed generally longitudinally from the cold air inlet 218 to the hot air exhaust 226 with a transverse portion to cool the compute components 204a-204c. In particular, air drops 234a-234c between the cold air plenum 216 and the hot air plenum 224 direct the first air flow 209 transversely with respect to a longitudinal axis of the server chassis 202. A portion of the first air flow 209 passes through each of the pair of openings of a respective air drop 234a-234c. The portions of the first air flow 209 passing through each air drop 234a-234c are in parallel with each other. In one embodiment, the raised shroud 232 passes over compute components 204 that are mounted to a bottom surface 253 of the server chassis 202 or a motherboard 254 on the bottom surface 253 (FIG. 3). A longitudinal passage 255 is formed by the raised shroud 232 closed from below by the bottom surface 253 and/or motherboard 254 (FIG. 3).

The air drops 234a-234b can pneumatically keep separate the first air flow 209 from other air flow through the raised shroud 232, specifically the second air flow 211. In particular, the intake opening 240 can be shaped to interface to a particular compute component 204a-204b. The second air flow 211 is directed generally longitudinally through the raised shroud 232 in the longitudinal passage 255 from the cold air inlet 218 to the hot air exhaust 226 (FIG. 3).

With particular reference to FIG. 3, the server 206 is illustrated with the ducting structure 208 (FIG. 2) rendered transparent to illustrate interfaces to the compute components 204, although the effects of the ducting structure 208 (FIG. 2) on the first and second air flows 209, 211 are still illustrated. In one embodiment, FIG. 3 illustrates the upstream compute components 204a, 204b as respectively being bi-directional heatsinks 248a, 248b. To accommodate the second air flow 211, the bi-directional heatsinks 248a, 248b are designed to each incorporate a tunnel 213 running substantially perpendicular to the direction of cooling fins 264 (FIG. 5) and the first air flow 209 to allow the second air flow 211 to traverse through the cooling fins 264 without being significantly pre-heated during such passage. The server 206 is configured to serve two central processing unit (CPU) sockets (not shown), which are depicted as being under heatsinks 248a, 248b. The heatsink-capped CPUs are serially aligned (from front to back sections of server chassis) in order to provide room for adjacent dual in-line memory modules (DIMMs) 250. Absent the innovative features of FIGS. 1-3 and the other aspects of the disclosure described herein, orienting CPUs in series causes thermal energy from the first, upstream CPU via heatsink 248a to preheat the second, downstream CPU mounted to heatsink 248b, as cooling air generally moves from a cold air inlet 218 to a hot air exhaust 226 of the server chassis 202. A downstream compute component 204c can also receive pre-heated air from both bi-directional heatsinks 248a, 248b.

Compute components 204a, 204b generate a relatively large amount of thermal energy. To prevent pre-heating of cooling air to compute components 204c, 204d, the first air flow 209 from air drops 234a, 234b is prevented from joining the second air flow 211 in the longitudinal passage 255. The second air flow 211 does not move along the cooling fins 264. In particular, the second air flow 211 does not flow parallel through a finset 262 as does the first air flow 209. Instead, the second air flow 211 is restricted to only the tunnels 213 of each heatsink 248a, 248b, which tunnels 213 allow the second air flow to pass through at relatively high velocity to cool downstream compute components 204. The relatively narrow size of the tunnel 213 directs a higher velocity stream of air with minimal surface area contact with the respective heatsink 248a, 248b. The air drops 234a-234c include or entirely comprise an opening on one side of the raised shroud 232 that communicates with the cold air plenum 216 and an opening on the other side of raised shroud 232 that communicates with the hot air plenum 224. In the exemplary embodiment, intake and outlet openings 240, 242 of air drops 234a, 234b are shaped to closely approximate and to expose lateral sides of bi-directional heatsinks 248a, 248b, directing the cold air through a finset 262 of each heatsink 248a, 248b. Thereby, both heatsinks 248a, 248b and their corresponding air drop 234a-234b provides parallel transverse paths to channel the first air flow 209, while allowing a relatively high velocity second air flow 211 to pass through the raised shroud 232 through the tunnels 213.

As one specific implementation (i.e., the illustrative embodiment), bi-directional heatsinks 248a, 248b are illustrated as benefiting from the ducting structure 208. However, the ducting structure 208 can be configured to support cooling of other numbers of heatsinks and various types of heatsinks. In addition, the ducting structure 208 can support cooling of other types of compute components 204c-204d that are not necessarily cooled by heatsinks.

Figure 4:
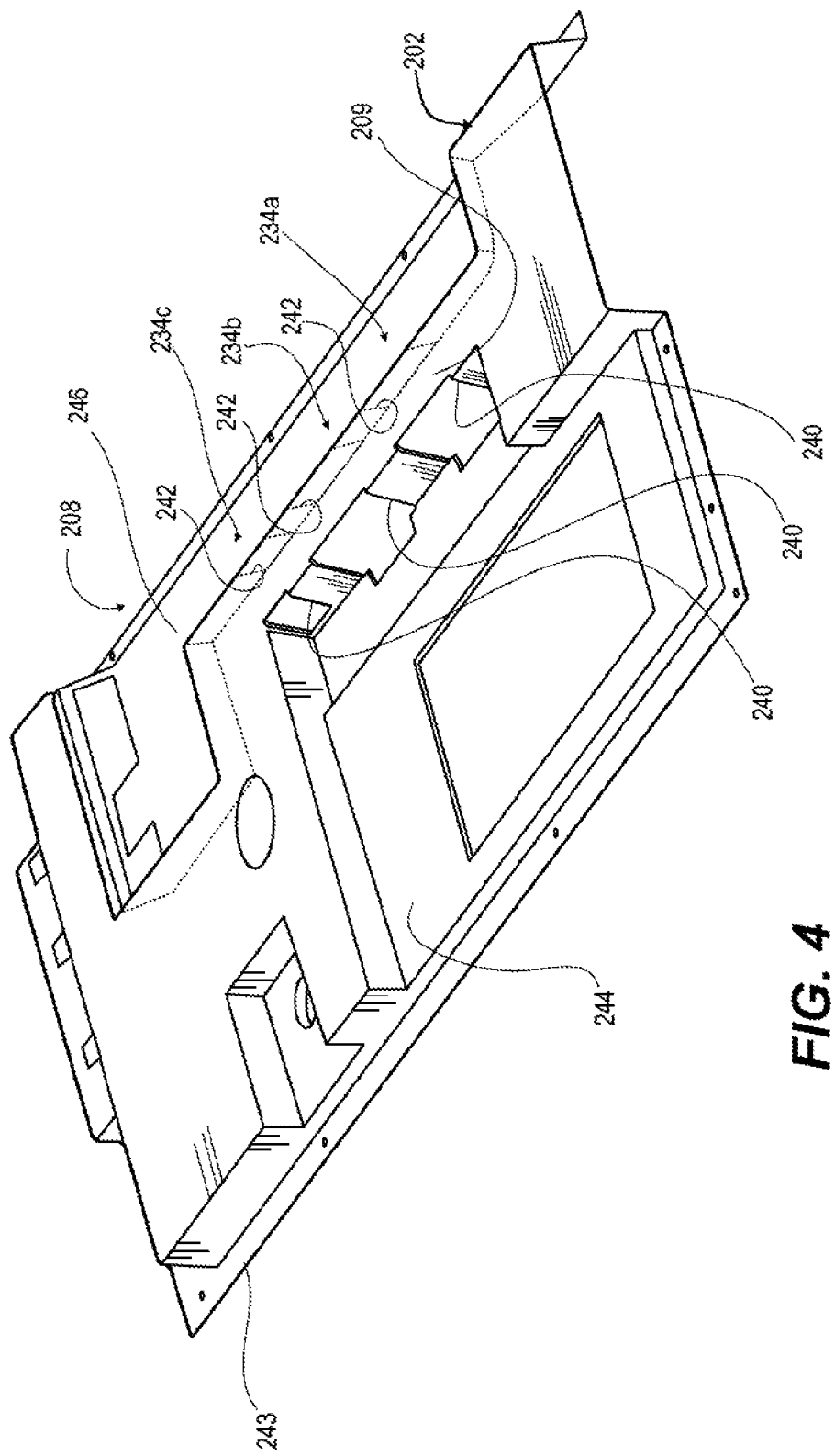
FIG. 4 illustrates a front right isometric view of the rack server of FIG. 1, according to one more embodiments.

FIG. 4 illustrates the ducting structure 208 with intake openings 240 of air drops 234a-234c on the side of the cold air plenum 216 being visible. FIG. 4 further illustrates outlet openings 242 of air drops 234a-234c on the side of the hot air plenum 224 hidden and illustrated in phantom. The molded tray 243 of the ducting structure 208 can be vacuum formed to form the raised shroud 232, which is flanked by the cold air recessed portion 244 and the hot air recessed portion 246.

Figure 5:
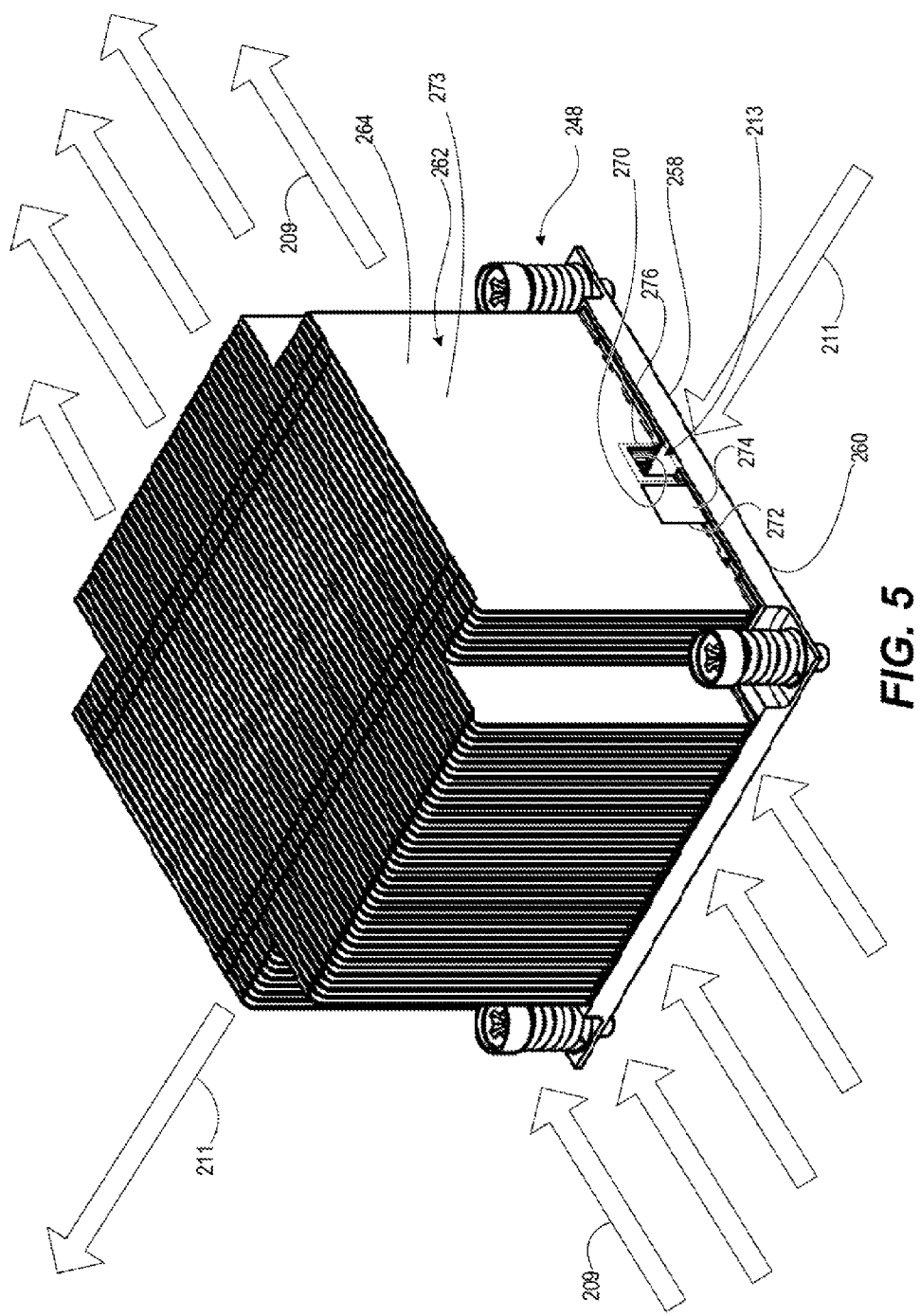
FIG. 5 illustrates a bi-directional heatsink of the rack server of FIG. 1 with an adjustment mechanism for balancing between each direction of air flow, according to one embodiment.

FIG. 5 illustrates a heatsink 248 that has a base 258 with surface 260 for receiving thermal energy from a compute component 204a-204c such as a CPU. The heatsink 248 dissipates thermal energy through the finset 262 that receives thermal energy from the base 258. The finset 262 is formed from more than one cooling fin 264 having a plate structure that is stamped from sheet metal. In one embodiment, each cooling fin 264 includes an aperture 270 stamped out during fabrication. Each cooling fin 264 is attached to the base 258 by solder brazing or press fitting in spaced arrangement with the apertures 270 aligned to form the tunnel 213. For clarity, the cooling fins 264 have a parallel arrangement; however, other geometric relationships can be incorporated. The finset 262 receives the first air flow 209 that is parallel to the surface 260 and to the plate structure of each cooling fin 264. To mitigate thermal shadowing of a downstream compute component 204c (FIG. 3), the heatsink 248 has a tunnel 213 formed through the more than one cooling fin 264. The tunnel 213 is also formed perpendicularly to the first air flow 209, directing the second air flow 211 to a downstream compute component 204c (FIG. 3). Fans 235 located at the hot air exhaust 226 (FIG. 2) pull the first and second air flows 209, 211. Although other embodiments can include cold air being pushed into the cold air inlet 218. In other embodiments, the first air flow 209 is supported by one or more dedicated fans and the second air flow 211 is supported by one or more dedicated fans.

Flow impedance of the first and second air flows 209, 211 are respectively tuned so that the majority of the total system airflow passes through the first direction (first air flow 209) of the heatsink 248a, 248b that is parallel to fin orientation. Only a small amount of total air passes through the air passages as second air flow 211 (perpendicular to fin orientation). This tuning can be accomplished by right-sizing the physical constraints on the first and second air flows 209, 211 so that they are appropriately proportioned in their flow impedance. For example, an aperture 270 of the tunnel 213 has a size that can dictate an air balance between the first and second air flows 209, 211. Other factors can affect the amount of air that moves through the first and second air flow. For example, one factor can be magnitude of air pressure presented respectively to the finset 262 of the heatsink 248 and to the tunnel 213. Another factor can be an effective aperture size presented by the finset 262. An additional factor can be pneumatic constraints provided by the air drops 234a-234c (FIG. 2), etc.

In one embodiment, the heatsink 248 includes a movable structure 272 constraining a size of the aperture 270 of the tunnel 213 to balance an amount of cooling air supplied to the first and second air flows 209, 211. The movable structure 272 can be a slider block that is slidably received in the base 258, overlapping a portion of an exposed surface 273 of the finset 262. The exposed surface 273 is the cooling fin 264 that is presented laterally across the raised shroud 232 upstream or downstream with respect to the other cooling fins 264 of the finset 262 relative to the directional flow of the second air flow 211. Alternatively or in addition, a slider block can be mounted to the cooling fin 264 that is presented laterally across the raised shroud 232 downstream with regard to the other cooling fins 264. The movable structure 272 is selectably positionable in a continuous range between an unobstructing state 274 and an obstructing state 276. The position of the movable structure 272 can be determined empirically for a group of similarly configured servers 206 by measuring an operational temperature within the server chassis 202 of a representative version of the IHS 200 instrumented with temperature sensors. The movable structure 272 can be moved from the obstructing state 276 incrementally toward the unobstructing state 274 until the measured temperature is lowered below a threshold. Similar servers 206 can be configured with the same position without testing.

Figure 6:
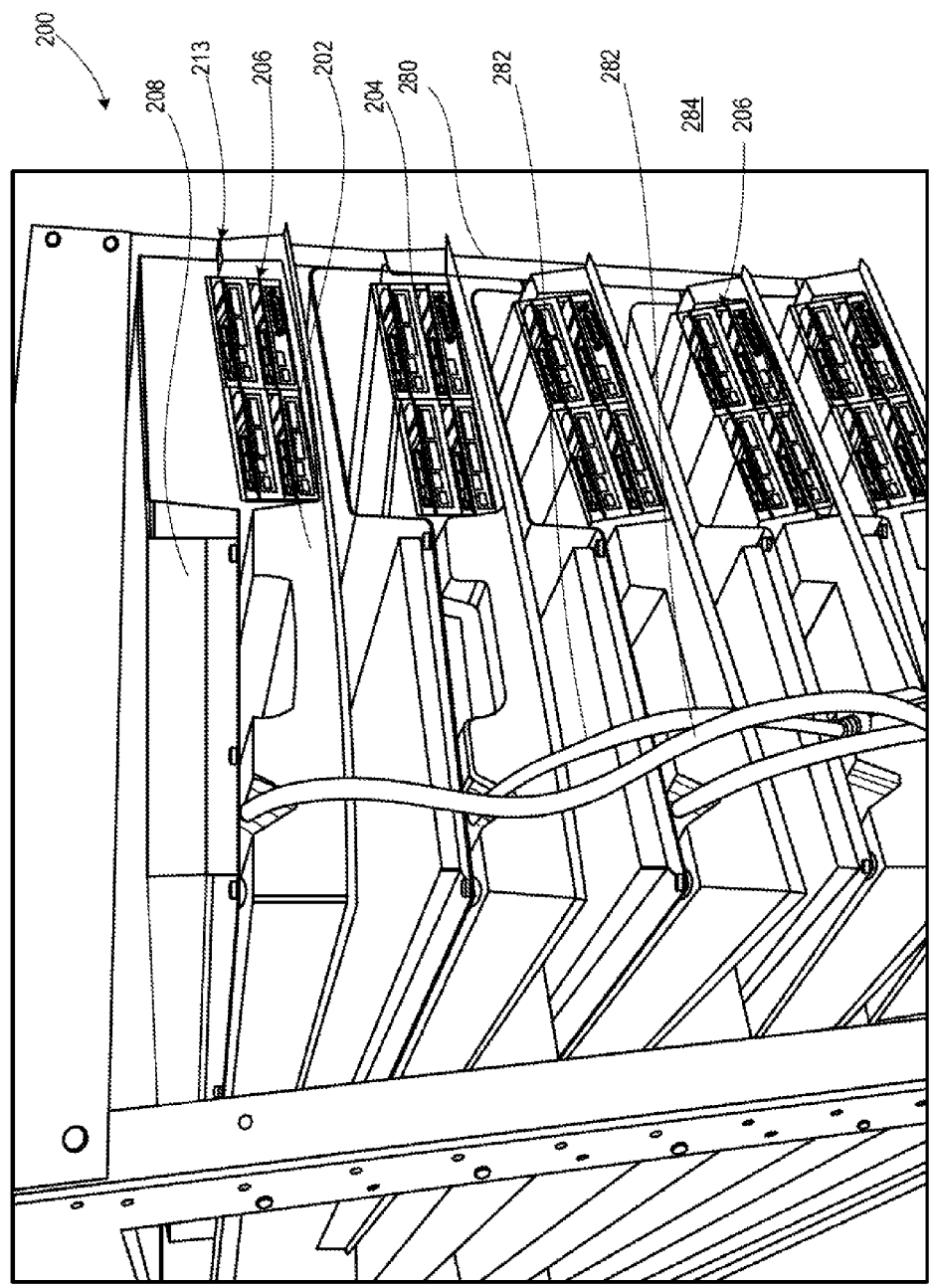
FIG. 6 illustrates the rack server of FIG. 1 mounted to a rack structure, according to one embodiment.

FIG. 6 illustrates an IHS 200 that includes a rack frame 280 that receives servers 206 having a ducting structure 208. Cabling interconnects 282 provide communication and electrical power to compute components 204 to create a functional IHS 200. Exterior cold air ducts and exterior hot air ducts (not shown) can interface the IHS 200 to a cooling system within a data center 284.

Figure 7:
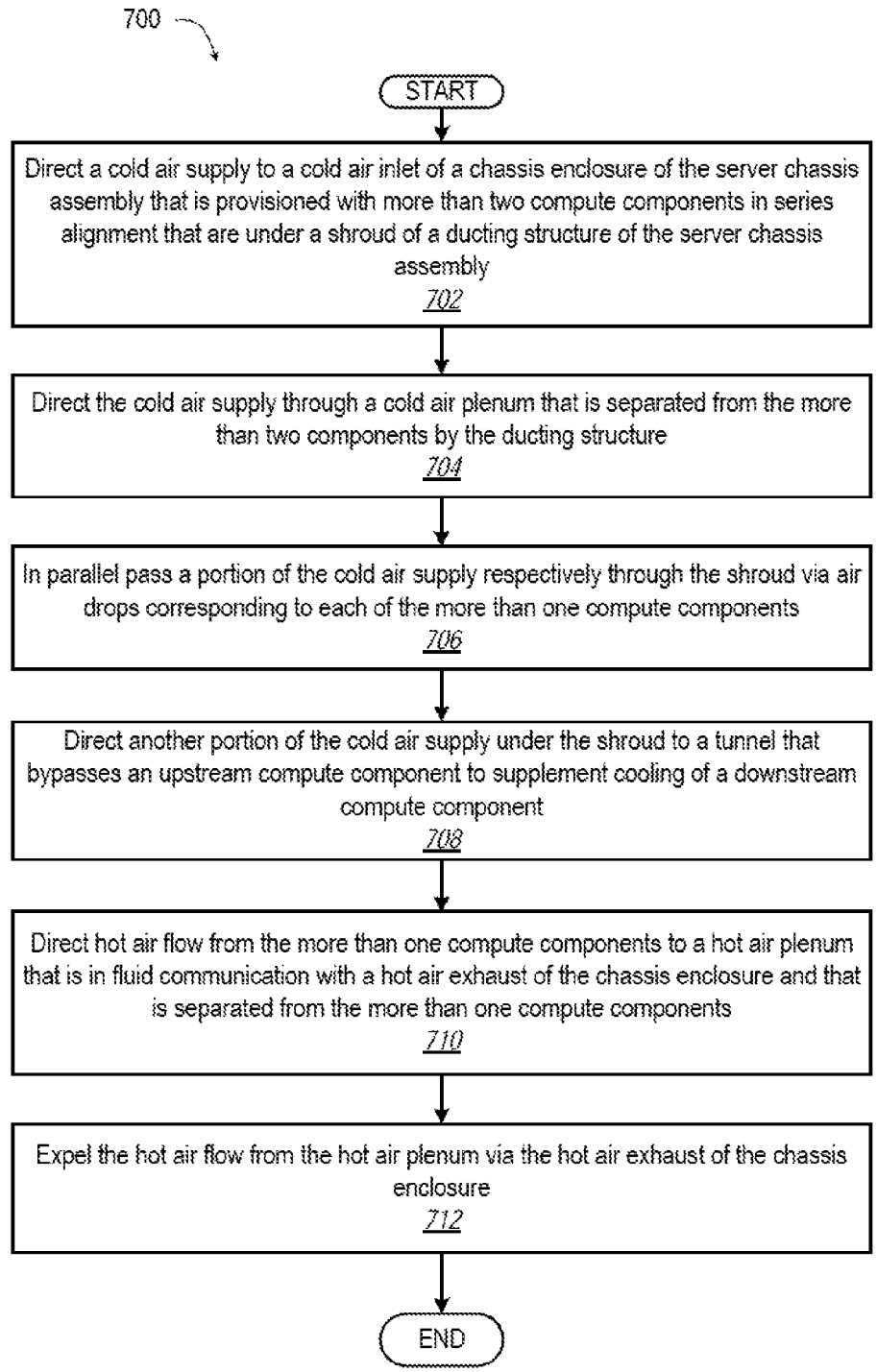
FIG. 7 illustrates a flow diagram of a method of cooling compute components of an IHS with a ducting structure, according to one embodiment.

FIG. 7 illustrates an exemplary method 700 of cooling of compute components provisioned in series alignment within a server chassis assembly of an IHS. In one embodiment, the method 700 begins at start block. The method 700 includes directing a cold air supply to a cold air inlet of a chassis enclosure of the server chassis assembly (block 702). The method 700 includes directing the cold air supply through a cold air plenum that is separated from the more than two components by the ducting structure (block 704). The method 700 includes passing a first portion of the cold air supply through the shroud via respective air drops each corresponding to one of the compute components (block 706). In one embodiment, the method 700 includes directing another portion of the cold air supply through the shroud to a tunnel, which allows the second portion of cold air supply to bypass an upstream compute component and provide cooling of a downstream compute component (block 708). The method 700 includes directing hot air flow from the compute components to a hot air plenum that is (a) in fluid communication with a hot air exhaust of the chassis enclosure and that is (b) separated from the compute components (block 710). Finally, the method 700 includes expelling the hot air flow from the hot air exhaust of the chassis enclosure (block 712). Then method 700 ends.

Figure 8:
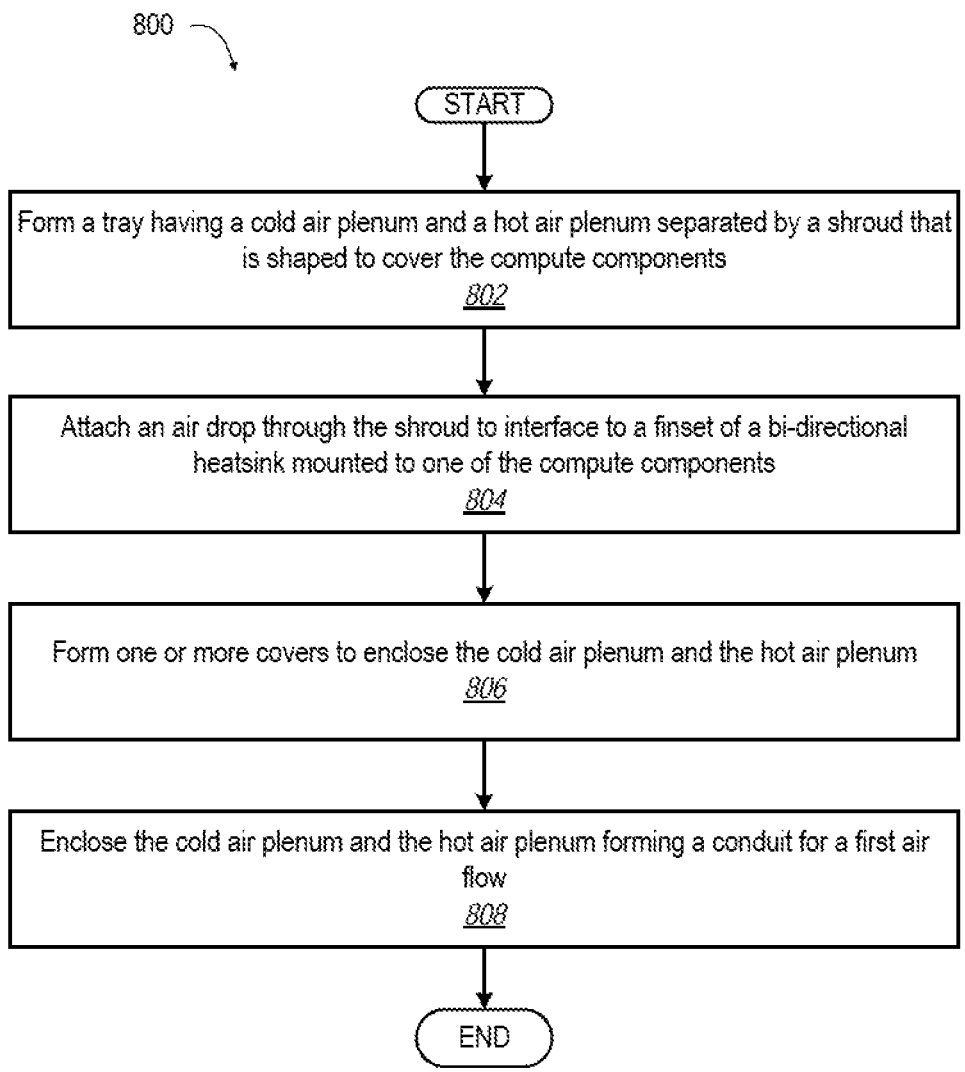
FIG. 8 illustrates a flow diagram of a method of manufacturing an embedded ducting system for a server chassis that is provisioned with serially aligned compute components, according to one embodiment.

FIG. 8 illustrates an exemplary method 800 of manufacturing an embedded ducting system for server chassis provisioned with compute components in serial alignment, according to one embodiment. The method 800 begins at start block. The method 800 includes forming a tray having a cold air plenum and a hot air plenum separated by a shroud that is shaped to cover the compute components (block 802). The tray can be formed by molding. The method 800 includes forming one or more air drops through the shroud to transversely direct cold air to one of the compute components from the cold air plenum to the hot air plenum (block 804). In one embodiment, the method 800 includes forming one or more covers to enclose the cold air plenum and the hot air plenum (block 806). The method 808 includes enclosing the cold air plenum and the hot air plenum forming a conduit for a first air flow (block 808). Then method 800 ends.

In the above described flow charts of FIGS. 7-8, one or more of the methods may be embodied in an automated manufacturing of an embedded ducting structure of a cooling system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
   a server chassis assembly comprising:
      a server chassis having a cold air inlet and a hot air exhaust;
      a ducting structure that is positioned in the server chassis and that (i) defines a cold air plenum in fluid communication with the cold air inlet, (ii) defines a hot air plenum in fluid communication with the hot air exhaust, and (iii) has a shroud that separates the cold air plenum and the hot air plenum, wherein the ducting structure comprises a molded tray contoured with the cold air plenum, the hot air plenum, and the shroud; and
      more than one air drop that each correspond to respective locations of a compute component and which are each in fluid communication between the cold air plenum and the hot air plenum, respectively directing cooling air supply through the shroud; and
   more than one compute components provisioned in the server chassis under the shroud of the ducting structure and in series alignment with each other between the cold air inlet and the hot air exhaust and which respectively receive cooling air supply from a respective one of the more than one air drop.

2. The IHS of claim 1, wherein:
   the ducting structure comprises a molded tray contoured with the cold air plenum, the hot air plenum, and the shroud.

3. The IHS of claim 1, wherein the ducting structure further comprises one or more covers enclosing the cold air plenum and the hot air plenum respectively.

4. The IHS of claim 1, wherein each of the more than one air drop comprise an intake opening and an outlet opening formed on lateral sides of the shroud corresponding to a lateral location of a respective one of the more than one compute components within the server chassis.

5. The IHS of claim 1, further comprising:
a rack structure receiving the server chassis assembly; and
one or more connecting cabling interconnecting the more than one compute components.

6. The IHS of claim 1, wherein:
the shroud laterally confines a second air flow that is (i) perpendicular to the first flow path, and that is (ii) longitudinally blocked by an upstream compute component of the more than one compute components; and
the IHS further comprises a tunnel through which the second air flow bypasses the upstream compute component supplementing cooling of a downstream compute component of the more than one compute components.

7. A server chassis assembly comprising:
a server chassis having a cold air inlet and a hot air exhaust; and
a ducting structure that is positioned in the server chassis and that (i) defines a cold air plenum in fluid communication with the cold air inlet, (ii) defines a hot air plenum in fluid communication with the hot air exhaust, and (iii) has a shroud that separates the cold air plenum and the hot air plenum, wherein the ducting structure comprises a molded tray contoured with the cold air plenum, the hot air plenum, and the shroud;
wherein the shroud is shaped for covering and for providing cooling air via a respective one of the more than one air drop to more than one compute components that are provisioned in the server chassis in series alignment between the cold air inlet and the hot air exhaust to supply cooling air to each of the more than one compute components.

8. The server chassis assembly of claim 1, wherein the ducting structure further comprises one or more covers enclosing the cold air plenum and the hot air plenum respectively.

9. The server chassis assembly of claim 7, wherein:
each of the more than one air drop comprise an intake opening and an outlet opening formed on lateral sides of the shroud corresponding to a respective one of the more than one compute components.

10. The server chassis assembly of claim 7, further comprising:
rack mounting features attached to the server chassis for mounting within a rack structure; and
one or more connecting cabling interconnecting the more than two compute components.

11. The server chassis of claim 7, wherein the shroud laterally confines a second air flow that is (i) perpendicular to the first flow path, and that is (ii) longitudinally blocked by an upstream compute component of the more than one compute components, and the server chassis further comprises a tunnel through which the second air flow bypasses the upstream compute component providing cooling of a downstream compute component of the more than one compute components.

12. A method of manufacturing an embedded ducting structure for cooling compute components provisioned in series in a server chassis assembly of an information handling system (IHS), the method comprising:
forming a tray having a cold air plenum and a hot air plenum separated by a shroud that is shaped to cover the compute components;
forming air drop through the shroud to interface to a finset of a bi-directional heatsink mounted to one of the compute components; and
enclosing the cold air plenum and the hot air plenum;
wherein the embedded ducting structure comprises the molded tray contoured with the cold air plenum, the hot air plenum, and the shroud.

13. The method of claim 12, wherein forming the tray comprises molding the tray.

14. The method of claim 12, wherein enclosing the cold air plenum and the hot air plenum comprises forming one or more covers to enclose the cold air plenum and the hot air plenum.

15. The method of claim 12, further comprising:
forming the shroud to laterally confine a second air flow; and
forming a tunnel that is longitudinally positioned under the shroud to bypass an upstream compute component of the more than one compute components to fluid communicate the second air flow to a downstream compute component of the more than one compute components.

16. A method of cooling of compute components provisioned in series alignment within a server chassis of an information handling system (IHS), the method comprising:
directing a cold air supply to a cold air inlet of a chassis enclosure of the server chassis assembly;
directing the cold air supply through a cold air plenum that is separated from the more than two components by a ducting structure;
passing a first portion of the cold air supply through a shroud via respective air drops each corresponding to one of the compute components;
directing hot air flow from the compute components to a hot air plenum that is (a) in fluid communication with a hot air exhaust of the chassis enclosure and that is (b) separated from the compute components; and
expelling the hot air flow from the hot air exhaust of the chassis enclosure;
wherein the ducting structure comprises a molded tray contoured with the cold air plenum, the hot air plenum, and the shroud.

17. The method of claim 16, further comprising directing another portion of the cold air supply through the shroud to a tunnel, bypassing an upstream compute component and providing cooling of a downstream compute component.

* * * * *